(12) United States Patent
Trinh

(10) Patent No.: US 7,397,699 B2
(45) Date of Patent: Jul. 8, 2008

(54) CHANNEL DISCHARGING AFTER ERASING FLASH MEMORY DEVICES

(75) Inventor: Stephen T. Trinh, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/190,722

(22) Filed: Jul. 27, 2005

(65) Prior Publication Data

US 2007/0025160 A1    Feb. 1, 2007

(51) Int. Cl.
*G11C 11/34* (2006.01)
(52) U.S. Cl. ............. 365/185.18; 365/185.27; 365/185.28; 365/185.29
(58) Field of Classification Search ............ 365/185.18, 365/185.25, 185.26, 185.27, 185.28, 185.29, 365/185.33
See application file for complete search history.

(56) References Cited

U.S. PATENT DOCUMENTS

| | | | | |
|---|---|---|---|---|
| 5,357,463 A * | 10/1994 | Kinney | | 365/185.18 |
| 5,521,866 A * | 5/1996 | Akaogi | | 365/185.29 |
| 5,615,152 A * | 3/1997 | Bergemont | | 365/185.18 |
| 5,617,357 A | 4/1997 | Haddad et al. | | 365/185.27 |
| 5,657,271 A * | 8/1997 | Mori | | 365/185.18 |
| 5,708,588 A * | 1/1998 | Haddad et al. | | 365/185.18 |
| 5,790,460 A * | 8/1998 | Chen et al. | | 365/185.29 |
| 5,978,276 A * | 11/1999 | Wong | | 365/185.29 |
| 5,982,671 A * | 11/1999 | Kang et al. | | 365/185.33 |
| 6,009,017 A * | 12/1999 | Guo et al. | | 365/185.18 |
| 6,049,486 A * | 4/2000 | Lee et al. | | 365/185.29 |
| 6,067,251 A * | 5/2000 | Hirano | | 365/185.18 |
| 6,122,201 A * | 9/2000 | Lee et al. | | 365/185.29 |
| 6,347,054 B1 * | 2/2002 | Wang et al. | | 365/185.29 |
| 6,373,746 B1 * | 4/2002 | Takeuchi et al. | | 365/185.25 |
| 6,549,465 B2 | 4/2003 | Hirano et al. | | 365/185.23 |
| 6,614,688 B2 * | 9/2003 | Jeong et al. | | 365/185.18 |
| 6,667,910 B2 | 12/2003 | Abedifard et al. | | 365/185.29 |
| 6,714,458 B2 | 3/2004 | Gualandri et al. | | 365/185.29 |
| 6,747,901 B2 * | 6/2004 | Hirano | | 365/185.29 |
| 6,839,284 B1 * | 1/2005 | Yang et al. | | 365/185.29 |
| 7,031,195 B2 * | 4/2006 | Sato et al. | | 365/185.29 |
| 7,193,902 B2 * | 3/2007 | Lee | | 365/185.29 |
| 2004/0184321 A1 | 9/2004 | Gualandri et al. | | 365/185.33 |

* cited by examiner

*Primary Examiner*—Trong Phan
(74) *Attorney, Agent, or Firm*—Schwegman, Lundberg, & Woessner, P.A.

(57) ABSTRACT

A post-erase channel clearing procedure for double well, floating gate, non-volatile memory cells. The channel is cleared of charged particles coming from the floating gate after an erase operation in two steps. In the first step the charged particles are pushed into an upper substrate well below the floating gate but not allowed into a deeper well of opposite conductivity type relative to the upper well. After a brief time, T, the charged particles are pushed by a bias voltage into the deeper well from the upper well. This two step clearing procedure avoids device latchup that might occur otherwise.

9 Claims, 3 Drawing Sheets

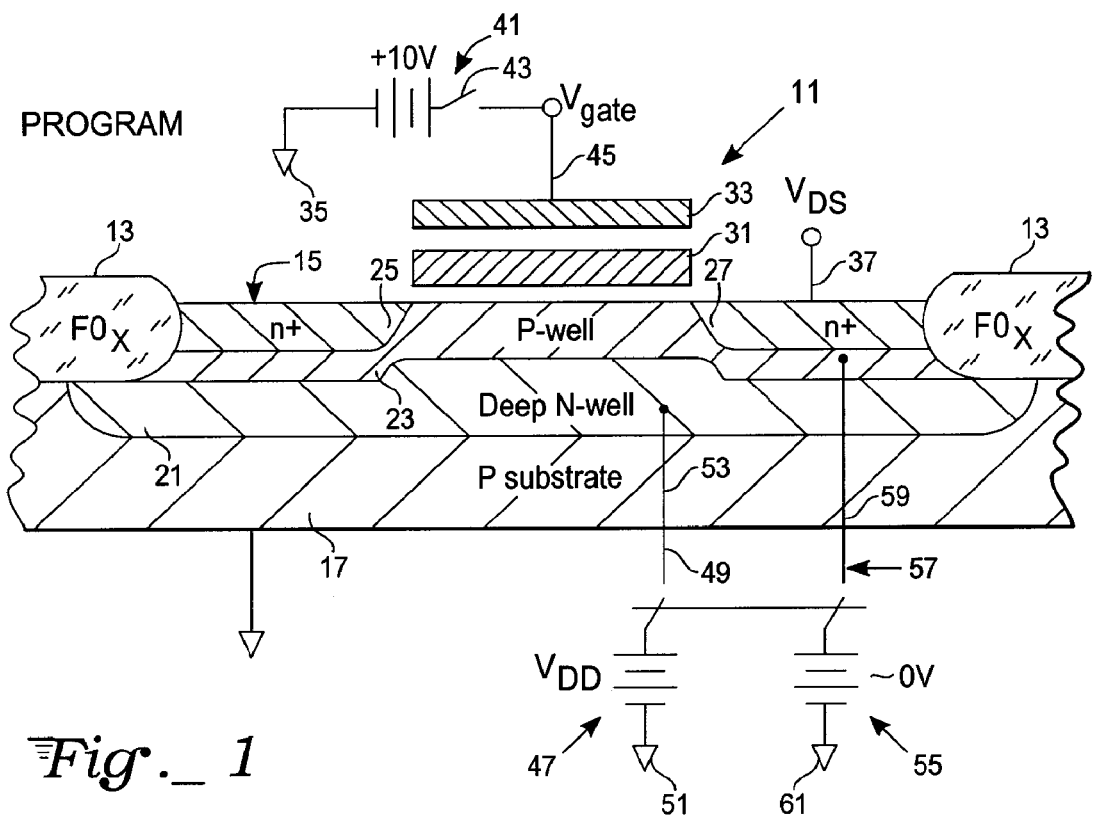
Fig._1
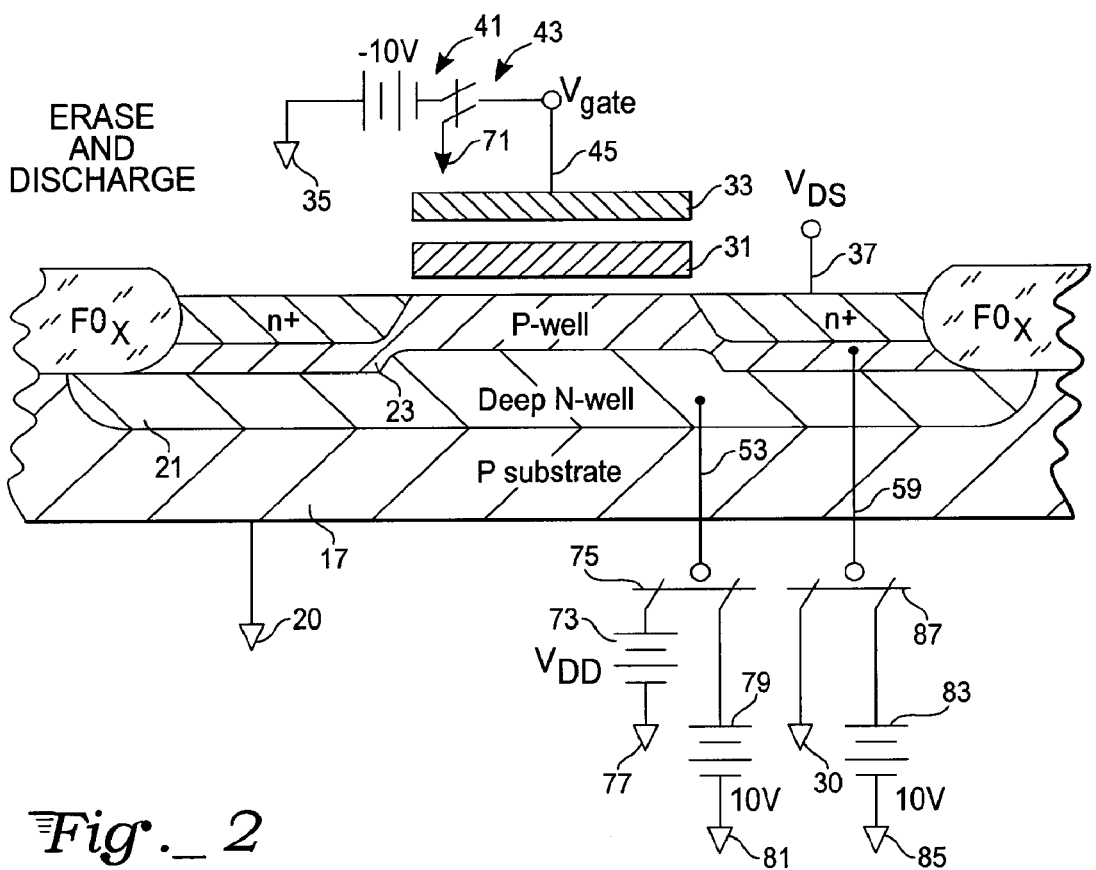
Fig._2

CHANNEL DISCHARGING AFTER ERASING FLASH MEMORY DEVICES

TECHNICAL FIELD

The invention relates to non-volatile memory transistors and, in particular, to a post-erase channel clearing procedure for double well non-volatile memory transistors in a flash array memory architecture.

BACKGROUND ART

Well voltage control after an erase operation in non-volatile memory transistors is important for preventing latchup, a condition that prevents useful operation. Generally, latchup occurs due to the presence of parasitic PN junctions, particularly when the junctions form parasitic NPN and PNP bipolar transistors. Typically a parasitic transistor is a vertical transistor formed in subsurface wells. When two parasitic transistors interact, the second one often a lateral transistor, latchup occurs. An anti-latchup invention is described in U.S. Pat. No. 6,549,465 to Y. Hirano et al. In the patent, a well voltage setting circuit has a P-MOS transistor for applying an erase pulse, a first N-MOS transistor for applying a reference voltage Vss to a P-well in a shutdown sequence after erase pulse application, and a second N-MOS transistor for forcing the P-well to a reference voltage during write and read. The first N-MOS transistor has a driving capacity set to about 1/50 of that of the second N-MOS transistor, so that a time for forcing the P-well to the reference voltage is long enough to prevent occurrence of local latchup during erase.

In flash memory arrays, the channel clearing operation after a flash erase has been known to employ a special discharge circuit. Such a discharge circuit is described in published U.S. Patent Application US2004/0184321 and U.S. Pat. No. 6,714,458, both to S. Gualandri et al. These documents describe an erase discharge circuit in a flash that is coupled to an array source and a P-well bias signal and receives first and second discharge signals. The erase discharge circuit operates during a discharge cycle in a first mode in response to the first discharge signal to couple the first node to the second node and to discharge voltages on the first and second nodes at a first rate. The erase discharge circuit operates in a second mode in response to the second discharge signal to couple the first node to the second node to discharge the voltages on the first and second nodes at a second rate.

In memory devices having a P-well within a deep N-well, the channel clearing operation after an erase can present a special challenge. For example, see U.S. Pat. No. 6,667,910 to Abedifard et al. This patent describes a flash memory device in which an erase voltage is applied to a well containing flash memory transistors. The well is then discharged toward ground, first by one discharge circuit which discharges the well until the voltage on the well is lower than a snap-back characteristic of a transistor employed in another well discharge circuit. After the well voltage is below the snap-back characteristic of the transistor, the well is discharged by the other discharge circuit.

The existence of a subsurface parasitic p-n junction in double well devices gives rise to special concerns. Forward bias on a vertical parasitic junction can cause device latchup. On the other hand, channel clearing voltages creating forward bias conditions are needed after erase pulses. An object of the invention is to devise a channel clearing bias scheme after an erase pulse which avoids forward bias conditions in parasitic p-n junctions formed by vertical subsurface wells.

SUMMARY

The above object has been achieved by following an erase operation with a two-stage channel clearing operation in a vertical double well device, i.e., having for example a P-well in a deep N-well. In the first stage the same or approximately the same (within 0.1 volts) high voltage on the deep well used for erase is maintained for channel clearing. This strongly attracts charged particles out of the channel. The shallow well within the deep well is at the same potential so that the deep well and shallow well are essentially reverse biased to prevent current flow due to the parasitic diode formed by the two wells. After an instant, the high voltage on the deep well is switched to Vcc, or an intermediate voltage, and the shallow well is grounded, to allow charged particles to continue to move toward the deep well and to a high capacity shorting supply, while relaxing any demand on the high voltage supply. The channel clearing method of the present invention is implemented with high voltage supplies of positive and negative (first and second) polarities regularly found in memory cells.

BRIEF DESCRIPTION OF THE DRAWINGS

FIG. 1 is a sectional plan view of a double well non-volatile memory transistor with program bias in accordance with the present invention.

FIG. 2 is a sectional plan view of the device of FIG. 1 with erase and discharge bias available in accordance with the present invention.

DETAILED DESCRIPTION

Figure 3:
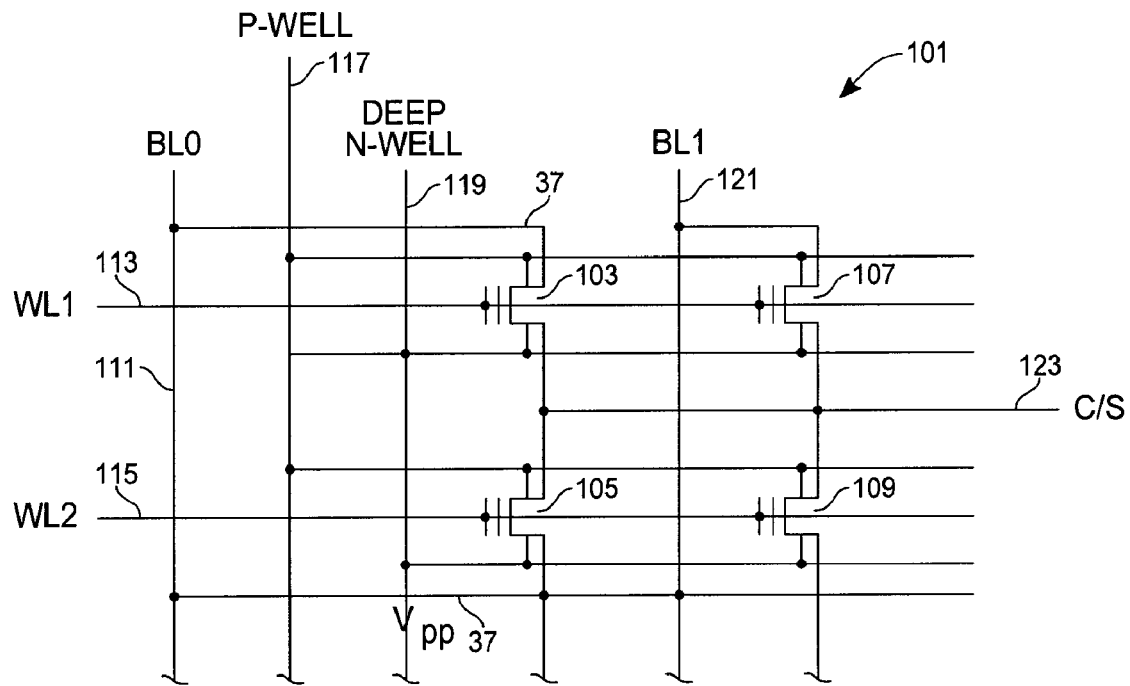
FIG. 3 is a schematic view of a portion of a memory array with memory transistors having bias lines to apply bias as shown in FIG. 2.

With reference to FIG. 1, a non-volatile memory cell 11, typically an EEPROM (electrically erasable programmable read only memory) transistor, is constructed within a silicon wafer or substrate 17, shown as a p-type substrate. Within this substrate the memory cell 11, an EEPROM device, is built within an active region defined by a field oxide $FO_X$ boundary 13. The substrate has a surface 15, with portions of the device above the surface and portions below.

Below surface 15, a deep N-well 21 is established in substrate 17, overlapping with the field oxide boundaries $FO_X$ 13 across the entire subsurface regions of the device, by implantation or diffusion of n-type ionic impurities in a known manner. After N-well 21 is established a less deep P-well 23 is established within the upper half, more or less, of the deep N-well 21. The P-well 23 extends from surface 15 downwardly to about one-half of the depth of the N-well 21 and from one field oxide boundary to the other. Building of a P-well within an N-well, within a p-substrate, is well known in EEPROM manufacturing. Within the P-well 23, a first and a second n+ ion implant 25 and 27 will serve as source and drain electrodes, with both the source and drain electrodes below surface 15, but with one electrode having an available bias lead 37, know as $V_{DS}$.

Above surface 15 the conductive floating gate 31, typically made from a layer of polysilicon, is situated roughly aligned with the interior edges of source and drain 25 and 27, or sometimes overlapping somewhat with the source and drain. Above the floating gate is control gate 33, also made from a layer of polysilicon and having the same dimensions as the control gate. The control gate is insulatively spaced over the floating gate, just as the floating gate is insulatively spaced over the surface 15 of the P-well 23, with insulation usually supplied by a silicon dioxide layer. While the floating gate 31 has no electrical contacts, the control gate is connected to a first bias supply 41 that is electrically grounded on the negative side to ground 35 and connected to a switch 43, typically a transistor, on the positive side, typically at positive ten volts in the programming mode, leading to a bias line or gate lead 45, known as $V_{gate}$. The charging and discharging of the floating gate are by known mechanisms, such as Fowler-Nordheim tunneling, or hot electron tunneling. In the programming mode, electrons are drawn from one subsurface electrode 25 or 27, onto the floating gate by tunneling action. The floating gate remains charged as an indication of the programmed state of the device until erased.

A second bias supply 47 has a negative side connected to ground lead 51 and a positive side, at about positive 1.8 (VDD) volts, connected to switch 49 and hence to the deep N-well lead 53. A third bias supply 55 has a positive side connected to switch 57 that is, in turn, connected to P-well lead 59, at about 0 volts and a negative side connected to ground lead 61. By maintaining these two regions at reverse electrical potential during a program operation there is no forward bias across the p-n junction that would cause a subsurface current to flow. Such subsurface currents lead to latchup, a condition that prevents proper memory cell conduction when the device is read.

The device of FIG. 2 is essentially the same device as in FIG. 1, except that bias configurations have been changed for erase and discharge operations. Voltage polarities are different and different voltage levels are available at each connection though double pole switches. The $V_{gate}$ lead 45 has the double pole switch 43, a transistor switch in actuality, connected to bias supply 41 which is now supplying negative 10 volts relative to the ground lead 35 during erase operations. Of particular importance, the P-well 23 has positive bias at +10 volts from bias supply 83 acting through the double pole switch 87 relative to ground 85 at the same time as negative bias is applied to control gate 33 from supply 41. The double pole switch 87 is a transistor switch. The positive bias on the P-well pulls electrons from the floating gate 31 and partially clears the channel immediately below the floating gate. At the same time, the deep N-well 21 is biased by a 10 volt 10V supply 79 having its negative terminal coupled to a ground 81 and acting through the double pole switch 75 to place a positive bias at +10 volts on the deep N-well. The drain and source are allowed to float, being pulled up to the P-well voltage of +10 volts. The +10 volt voltages on both the deep N-well 21 and the P-well 23 are an effective reverse bias on the parasitic P-N junction between these two regions, preventing conduction, as well as being an effective reverse bias relative to ground 20 for the parasitic P-N junction between the deep N-well 21 and the P substrate 17. Subsurface currents in these parasitic P-N junctions might occur without such reverse bias and such currents could cause device latchup by preventing proper transistor action.

To complete the erase operation it is necessary to clear the channel of electrons. To accomplish this, the control gate is grounded at ground 71 through switch 41 and just before the P-well 23 is grounded at ground 30. The deep N-well 21 is still biased at +10 volts, but after a time, T, the deep N-well is discharged to VDD using supply 73, acting through switch 75 and having its negative terminal coupled to a ground 77. The time T is a time shorter than the time before another possible program operation by at least one-half of a cycle. The shift or lowering of the voltage in the deep N-well allows current flow in the parasitic diode formed between the P-well and the deep N-well but in a controlled manner, preventing excess electrons from being trapped in the p-well 23. Vcc is the usual bias voltage used in sense amplifiers and other auxiliary memory transistors.

With reference to FIG. 3, a portion of a flash memory array 101 is shown having rows and columns of memory cells. For example, EEPROM transistors 103 and 105 are shown in a first column and EEPROM transistors 107 and 109 are shown in a second column. Each of the memory transistors has P-well and deem N-well bias lines. For example, the P-well bias line 117 provides simultaneous bias to all memory cells in the array and the deep N-well bias line 119, parallel to line 117, also provides simultaneous bias to all memory cells in the array. The parallel bit line BL0 111, associated with $V_{DS}$ line 37 and the parallel bit line BL1 121, associated with a similar $V_{DS}$ line, together with the parallel word lines WL1 113 and WL2 115, and the chip select C/S line 123, serve to provide transistor selection voltages so that each individual transistor can be addressed for programming and reading, but all transistors are simultaneously erased and discharged.

Figure 4:
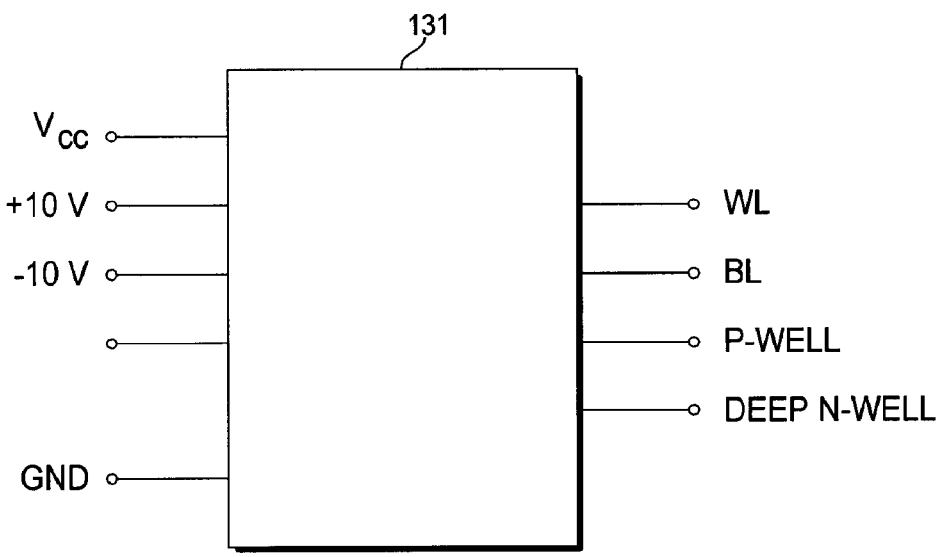
FIG. 4 is a top view of an integrated circuit package containing a memory array, as in FIG. 3, having pins for bias voltages as shown in FIGS. 1 and 2.

FIG. 4 shows a packaged flash memory array chip 131 with various external bias voltages applied to the chip including Vcc, +10 volts, −10 volts and ground. These are the fundamental voltages supplied to the chip. All other voltages can be obtained from these. Word line WL and bit line BL voltages can be from a separate supply or may be derived from other voltages. Similarly the P-well and the deep N-well voltages can be from a separate supply or may be derived from other voltages already present.

Figure 5:
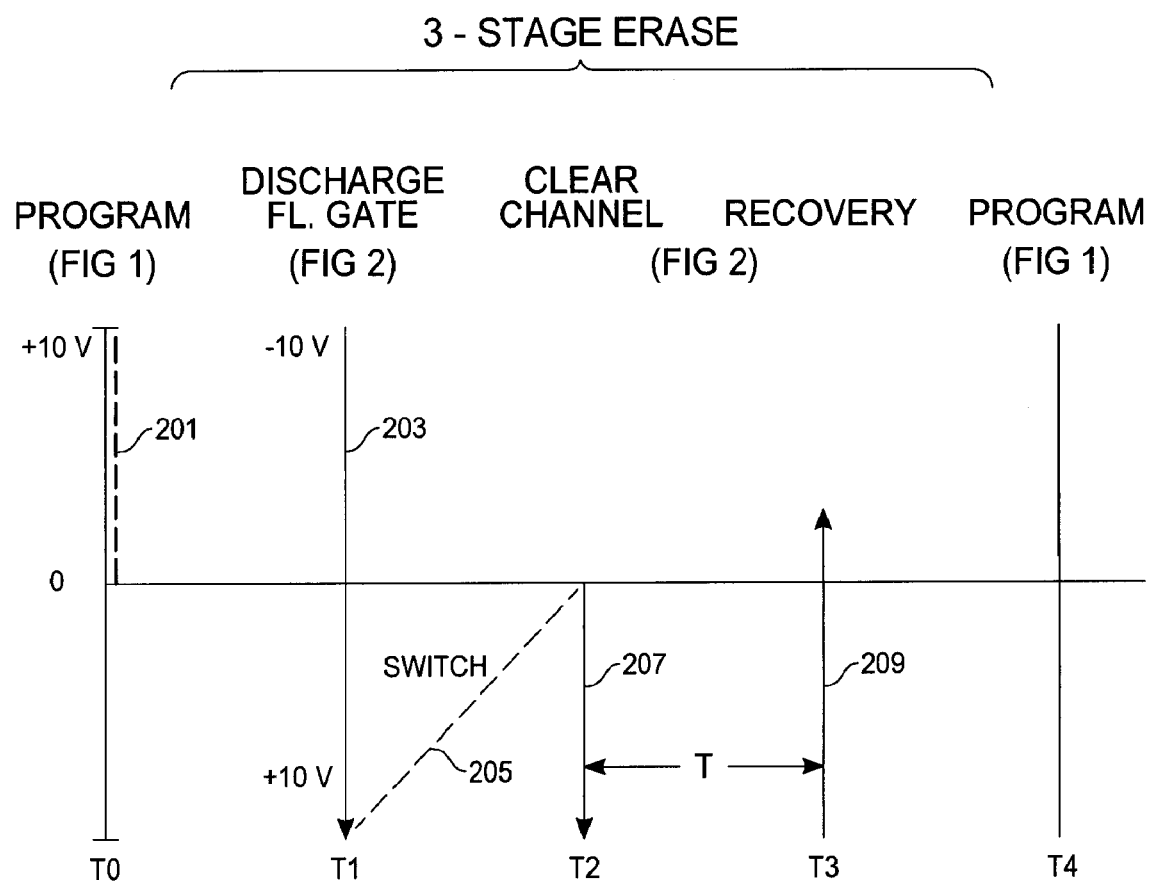
FIG. 5 is a time versus voltage chart for operating the apparatus of FIGS. 1 and 2.

With reference to FIG. 5, a three-stage erase operation is shown. Programming occurs at a time, T0, where a first voltage is applied to the device of FIG. 1, labeled PROGRAM, showing +10 volts on control gate 33, approximately 0 volts on P-well 23 and VTD on N-well 21. VDD is close to 0 volts within a volt or two. An erase cycle is commenced at a time T1 where a voltage labeled DISCHARGE FLOATING GATE shows application of −10 volts on control gate 33 and +10 volts on both N-well 21 and P-well 23. DOWN arrow 2 or 3 is illustrative of this voltage. At a later time, T2, a switch applies new voltages to the device and the control gate, formerly at +10 volts is switched to ground 31 but the deep N-well is still biased at +10 volts, indicated by arrow 207. This is a channel clearing operation after the switch, indicated by line 205 as shown. After a time T, the deep N-well is discharged at time T3 to voltage VDD, indicated by arrow 209. The time T is shorter than the time for the next memory operation, a programming operation which occurs at time T4 since memory operations are sequential program and erase operations.

What is claimed is:

1. A method of channel clearing in a double well floating gate non-volatile memory device subject to sequential program and erase operations comprising:

discharging the floating gate into a double well vertical p and n type subsurface structure, said structure being disposed in a substrate of the non-volatile memory device and being insulated from the floating gate of the device, by applying an erase voltage at a first causing charged particle flow from the floating gate to a first well in the substrate;

then at a second time discharging the first well into a second well in the substrate by using a switch applying a channel-clearing voltage causing charged particle flow from the first well into the second well; and then at a third time discharging the second well using said switch.

2. The method of claim 1 wherein the erase voltage is a greater potential than the channel-clearing voltage.

3. The method of claim 1 wherein the discharging of the second well is applied at a time, T, after the discharging of the first well wherein the time, T, is less than the time for a next sequential program and erase operation.

4. A method of channel clearing in a double well floating gate non-volatile memory device subject to sequential program and erase operations comprising:
   discharging the floating gate at a first time by controlling voltages on a control gate above the floating gate and in a subsurface region below the floating gate; and
   starting a channel clearing operation at a second time after initiation of the discharging step at a first voltage level but changing to a second voltage level at a third time before the next memory operation that provides a discharge path through the double wells.

5. The method of claim 4 wherein voltages in the subsurface region below the floating gate is applied through double wells, one double well atop the other double well.

6. The method of claim 4 wherein the first voltage level establishes a greater potential difference relative to the voltage in a control gate above the floating gate than the second voltage level.

7. The method of claim 5 wherein said double wells form a parasitic p-n diode junction wherein said first and second voltage levels provide a reverse bias across the p-n junction.

8. A method of channel clearing in a double well floating gate memory transistor having a control gate above the floating gate and a substrate of a first conductivity type, a first well of the first conductivity type in a deep second well of a second conductivity type thereby forming at least one subsurface parasitic p-n junction, comprising:
   discharging the floating gate at a first time by a high voltage having a first polarity on the control gate and a second polarity on both the first well and the second well;
   clearing the channel at a second time later than the first time by grounding the control gate and grounding the first well while allowing the second well to remain at the voltage of the second polarity thereby reverse biasing the parasitic p-n junction of first and second wells;
   after a third time, lowering the voltage of the second well to an intermediate voltage while the first well remains at ground.

9. The method of claim 8 wherein the voltage of the first polarity for discharging the floating gate is approximately equal in voltage to the voltage of second polarity.

* * * * *

UNITED STATES PATENT AND TRADEMARK OFFICE
CERTIFICATE OF CORRECTION

PATENT NO.        : 7,397,699 B2                                      Page 1 of 1
APPLICATION NO.   : 11/190722
DATED             : July 8, 2008
INVENTOR(S)       : Trinh It is certified that error appears in the above-identified patent and that said Letters Patent is hereby corrected as shown below:

In column 4, line 6, delete "p-well" and insert -- P-well --, therefor.

In column 4, line 14, delete "deem" and insert -- deep --, therefor.

In column 4, line 61, in Claim 1, after "first" insert -- time --.

In column 5, line 25, in Claim 6, delete "a" and insert -- the --, therefor.

Signed and Sealed this

Eighteenth Day of November, 2008

JON W. DUDAS
*Director of the United States Patent and Trademark Office*